US008145499B2

(12) United States Patent
Herre et al.

(10) Patent No.: US 8,145,499 B2
(45) Date of Patent: Mar. 27, 2012

(54) GENERATION OF DECORRELATED SIGNALS

(75) Inventors: Juergen Herre, Buckenhof (DE); Karsten Linzmeier, Erlangen (DE); Harald Popp, Tuchenbach (DE); Jan Plogsties, Erlangen (DE); Harald Mundt, Erlangen (DE); Sascha Disch, Fuerth (DE)

(73) Assignee: Fraunhofer-Gesellschaft zur Foerderung der Angewandten Forschung e.V., Munich (DE)

( * ) Notice: Subject to any disclaimer, the term of this patent is extended or adjusted under 35 U.S.C. 154(b) by 604 days.

(21) Appl. No.: 12/440,940

(22) PCT Filed: Apr. 14, 2008

(86) PCT No.: PCT/EP2008/002945
§ 371 (c)(1),
(2), (4) Date: Mar. 12, 2009

(87) PCT Pub. No.: WO2008/125322
PCT Pub. Date: Oct. 23, 2008

(65) Prior Publication Data

US 2009/0326959 A1 Dec. 31, 2009

(30) Foreign Application Priority Data

Apr. 17, 2007 (DE) ......................... 10 2007 018 032

(51) Int. Cl.
*G10L 19/00* (2006.01)
*H03G 3/00* (2006.01)

(52) U.S. Cl. ......................................... 704/502; 381/63

(58) Field of Classification Search ........................ None
See application file for complete search history.

(56) References Cited

U.S. PATENT DOCUMENTS

| | | | | |
|---|---|---|---|---|
| 4,792,974 | A * | 12/1988 | Chace | 381/1 |
| 6,526,091 | B1 | 2/2003 | Nyström et al. | |
| 7,092,542 | B2 * | 8/2006 | McGrath | 381/307 |
| 7,444,194 | B2 * | 10/2008 | Fay et al. | 700/94 |
| 7,688,989 | B2 * | 3/2010 | Willems | 381/310 |
| 7,983,424 | B2 * | 7/2011 | Kjorling et al. | 381/22 |
| 8,015,018 | B2 * | 9/2011 | Seefeldt et al. | 704/501 |
| 2005/0047618 | A1 | 3/2005 | Davis et al. | |
| 2006/0029239 | A1 | 2/2006 | Smithers | |
| 2006/0053018 | A1 | 3/2006 | Engdegard et al. | |
| 2006/0165184 | A1 | 7/2006 | Purnhagen et al. | |

(Continued)

FOREIGN PATENT DOCUMENTS

RU 2 234 196 C2 8/2004

(Continued)

OTHER PUBLICATIONS

English language translation of Official Communication issued in corresponding Japanese Patent Application No. 2009-529719, mailed on Sep. 28, 2010.

(Continued)

*Primary Examiner* — Brian Albertalli
(74) *Attorney, Agent, or Firm* — Keating & Bennett, LLP

(57) ABSTRACT

In a case of transient audio input signals, in a multi-channel audio reconstruction, uncorrelated output signals are generated from an audio input signal in that the audio input signal is mixed with a representation of the audio input signal delayed by a delay time such that, in a first time interval, a first output signal corresponds to the audio input signal, and a second output signal corresponds to the delayed representation of the audio input signal, wherein, in a second time interval, the first output signal corresponds to the delayed representation of the audio input signal, and the second output signal corresponds to the audio input signal.

26 Claims, 7 Drawing Sheets

U.S. PATENT DOCUMENTS

| | | | | |
|---|---|---|---|---|
| 2006/0239473 | A1 | 10/2006 | Kjorling et al. | |
| 2007/0121952 | A1 * | 5/2007 | Engdegard et al. | 381/10 |
| 2008/0031463 | A1 * | 2/2008 | Davis | 381/17 |
| 2009/0052681 | A1 * | 2/2009 | Schobben et al. | 381/63 |

FOREIGN PATENT DOCUMENTS

| | | | |
|---|---|---|---|
| WO | 2005/086139 | A1 | 9/2005 |
| WO | 2005/091678 | A1 | 9/2005 |
| WO | 2006/008697 | A1 | 1/2006 |
| WO | 2006/019719 | A1 | 2/2006 |
| WO | 2006/108543 | A1 | 10/2006 |

OTHER PUBLICATIONS

Translation of Official Communication issued in corresponding International Patent Application No. PCT/EP2008/002945, mailed on Nov. 19, 2009.

Official Communication issued in International Patent Application No. PCT/EP2008/002945, mailed on Aug. 14, 2008.

Purnhagen; "Low Complexity Parametric Stereo Coding in MPEG-4"; 7th International Conference on Audio Effects (DAFX-04); Naples, Italy; Oct. 5-8, 2004, pp. 163-168.

Villemoes et al.; "MPEG Surround:The Forthcoming ISO Standard for Spatial Audio Coding"; AES 28th International Conference; Pitea, Sweden; Jun. 30-Jul. 2, 2006, pp. 1-18.

Blauert; "Spatial Hearing: The Psychophysics of Human Sound Localization"; MIT Press, Revised Edition; 1997, pp. 222-225 and pp. 238-271.

Official Communication issued in corresponding Russian Patent Application No. 2009116268/09(022347), mailed on Jul. 8, 2010.

* cited by examiner

GENERATION OF DECORRELATED SIGNALS

BACKGROUND OF THE INVENTION

The present invention involves an apparatus and a method of generating decorrelated signals and in particular the ability of deriving decorrelated signals from a signal containing transients such that reconstructing a four-channel audio signal and/or a future combination of the decorrelated signal and the transient signal will not result in any audible signal degradation.

Many applications in the field of audio signal processing necessitate generating a decorrelated signal based on an audio input signal provided. As examples thereof, the stereo upmix of a mono signal, the four-channel upmix based on a mono or stereo signal, the generation of artificial reverberation or the widening of the stereo basis may be named.

Current methods and/or systems suffer from extensive degradation of the quality and/or the perceivable sound impression when confronted with a special class of signals (applause-like signals). This is specifically the case when the playback is effected via headphones. In addition to that, standard decorrelators use methods exhibiting high complexity and/or high computing expenditure.

For emphasizing the problem, FIGS. 7 and 8 show the use of decorrelators in signal processing. Here, brief reference is made to the mono-to-stereo decoder shown in FIG. 7.

Same comprises a standard decorrelator 10 and a mix matrix 12. The mono-to-stereo decoder serves for converting a fed-in mono signal 14 to a stereo signal 16 consisting of a left channel 16*a* and a right channel 16*b*. From the fed-in mono signal 14, the standard decorrelator 10 generates a decorrelated signal 18 (D) which, together with the fed-in mono signal 14, is applied to the inputs of the mix matrix 12. In this context, the untreated mono signal is often also referred to as a "dry" signal, whereas the decorrelated signal D is referred to as a "wet" signal.

The mix matrix 12 combines the decorrelated signal 18 and the fed-in mono signal 14 so as to generate the stereo signal 16. Here, the coefficients of the mix matrix 12 (H) may either be fixedly given, signal-dependent or dependent on a user input. In addition, this mixing process performed by the mix matrix 12 may also be frequency-selective. I.e., different mixing operations and/or matrix coefficients may be employed for different frequency ranges (frequency bands). For this purpose, the fed-in mono signal 14 may be preprocessed by a filter bank so that same, together with the decorrelated signal 18, is present in a filter bank representation, in which the signal portions pertaining to different frequency bands are each processed separately.

The control of the upmix process, i.e. of the coefficients of the mix matrix 12, may be performed by user interaction via a mix control 20. In addition, the coefficients of the mix matrix 12 (H) may also be effected via so-called "side information", which is transferred together with the fed-in mono signal 14 (the downmix). Here, the side information contains a parametric description as to how the multi-channel signal generated is to be generated from the fed-in mono signal 14 (the transmitted signal). This spatial side information is typically generated by an encoder prior to the actual downmix, i.e. the generation of the fed-in mono signal 14.

The above-described process is normally employed in parametric (spatial) audio coding. As an example, the so-called "Parametric Stereo" coding (H. Purnhagen: "Low Complexity Parametric Stereo Coding in MPEG-4", $7^{th}$ International Conference on Audio Effects (DAFX-04), Naples, Italy, October 2004) and the MPEG Surround method (L. Villemoes, J. Herre, J. Breebaart, G. Hotho, S. Disch, H. Purnhagen, K. Kjörling: "MPEG Surround: The forthcoming ISO standard for spatial audio coding", AES $28^{th}$ International Conference, Piteå, Sweden, 2006) use such a method.

One typical example of a Parametric Stereo decoder is shown in FIG. 8. In addition to the simple, non-frequency-selective case shown in FIG. 7, the decoder shown in FIG. 6 comprises an analysis filter bank 30 and a synthesis filter bank 32. This is the case, as here decorrelating is performed in a frequency-dependent manner (in the spectral domain). For this reason, the fed-in mono signal 14 is first split into signal portions for different frequency ranges by the analysis filter bank 30. I.e., for each frequency band its own decorrelated signal is generated analogously to the example described above. In addition to the fed-in mono signal 14, spatial parameters 34 are transferred, which serve to determine or vary the matrix elements of the mix matrix 12 so as to generate a mixed signal which, by means of the synthesis filter bank 32, is transformed back into the time domain so as to form the stereo signal 16.

In addition, the spatial parameters 34 may optionally be altered via a parameter control 36 so as to generate the upmix and/or the stereo signal 16 for different playback scenarios in a different manner and/or optimally adjust the playback quality to the respective scenario. If the spatial parameters 34 are adjusted for binaural playback, for example, the spatial parameters 34 may be combined with parameters of the binaural filters so as to form the parameters controlling the mix matrix 12. Alternatively, the parameters may be altered by direct user interaction or other tools and/or algorithms (see, for example: Breebart, Jeroen; Herre, Jurgen; Jin, Craig; Kjörling, Kristofer; Koppens, Jeroen; Plogisties, Jan; Villemoes, Lars: Multi-Channel Goes Mobile: MPEG Surround Binaural Rendering. AES $29^{th}$ International Conference, Seoul, Korea, 2006 Sep. 2-4).

The output of the channels L and R of the mix matrix 12 (H) is generated from the fed-in mono signal 14 (M) and the decorrelated signal 18 (D) as follows, for example:

$$\begin{bmatrix} L \\ R \end{bmatrix} = \begin{bmatrix} h_{11} & h_{12} \\ h_{21} & h_{22} \end{bmatrix} \begin{bmatrix} M \\ D \end{bmatrix}$$

Therefore, the portion of the decorrelated signal 18 (D) contained in the output signal is adjusted in the mix matrix 12. In the process, the mixing ratio is time-varied based on the spatial parameters 34 transferred. These parameters may, for example, be parameters describing the correlation of two original signals (parameters of this kind are used in MPEG Surround Coding, for example, and there are referred to, among other things, as ICC). In addition, parameters may be transferred, which transfer the energy ratios of two channels originally present, which are contained in the fed-in mono signal 14 (ICLD and/or ICD in MPEG Surround). Alternatively, or in addition, the matrix elements may be varied by direct user input.

For the generation of the decorrelated signals, a series of different methods have so far been used.

Parametric Stereo and MPEG Surround use all-pass filters, i.e. filters passing the entire spectral range but having a spectrally dependent filter characteristic. In Binaural Cue Coding (BCC, Faller and Baumgarte, see, for example: C. Faller: "Parametric Coding Of Spatial Audio", Ph.D. thesis, EPFL, 2004) a "group delay" for decorrelation is proposed. For this purpose, a frequency-dependent group delay is applied to the signal by altering the phases in the DFT spectrum of the signal. That is, different frequency ranges are delayed for different periods of time. Such a method usually falls under the category of phase manipulations.

In addition, the use of simple delays, i.e. fixed time delays, is known. This method is used for generating surround signals for the rear speakers in a four-channel configuration, for example, so as to decorrelate same from the front signals as far as perception is concerned. A typical such matrix surround system is Dolby ProLogic II, which uses a time delay from 20 to 40 ms for the rear audio channels. Such a simple implementation may be used for creating a decorrelation of the front and rear speakers as same is substantially less critical, as far as the listening experience is concerned, than the decorrelation of left and right channels. This is of substantial importance for the "width" of the reconstructed signal as perceived by the listener (see: J. Blauert: "Spatial hearing: The psychophysics of human sound localization"; MIT Press, Revised edition, 1997).

The popular decorrelation methods described above exhibit the following substantial drawbacks:

spectral coloration of the signal (comb-filter effect)

reduced "crispness" of the signal disturbing echo and reverberation effects unsatisfactorily perceived decorrelation and/or unsatisfactory width of the audio mapping repetitive sound character.

Here, the invention has shown that it is in particular signals having high temporal density and spatial distribution of transient events, which are transferred together with a broadband noise-like signal component, that represent the signals most critical for this type of signal processing. This is in particular the case for applause-like signals possessing the above-mentioned properties. This is due to the fact that, by the decorrelation, each single transient signal (event) may be smeared in terms of time, whereas at the same time the noise-like background is rendered spectrally colored due to comb-filter effects, which is easy to perceive as a change in the signal's timbre.

To summarize, the known decorrelation methods either generate the above-mentioned artifacts or else are unable to generate the necessitated degree of decorrelation.

It is especially to be noted that listening via headphones is generally more critical than listening via speakers. For this reason, the above-described drawbacks are relevant in particular for applications that generally necessitate listening by means of headphones. This is generally the case for portable playback devices, which, in addition, have a low energy supply only. In this context, the computing capacity which has to be spent on the decorrelation is also an important aspect. Most of the known decorrelation algorithms are extremely computationally intensive. In an implementation these therefore necessitate a relatively high number of calculation operations, which result in having to use fast processors, which inevitably consume large amounts of energy. In addition, a large amount of memory is required for implementing such complex algorithms. This, in turn, results in increased energy demand.

Particularly in the playback of binaural signals (and in listening via headphones) a number of special problems will occur concerning the perceived reproduction quality of the rendered signal. For one thing, in the case of applause signals, it is particularly important to correctly render the attack of each clapping event so as not to corrupt the transient event. A decorrelator is therefore required, which does not smear the attack in time in terms of time, i.e. which does not exhibit any temporally dispersive characteristic. Filters described above, which introduce frequency-dependent group delay, and all-pass filters in general are not suitable for this purpose. In addition, it is a need to avoid a repetitive sound impression as is caused by a simple time delay, for example. If such a simple time delay were used to generate a decoded signal, which was then added to the direct signal by means of a mix matrix, the result would sound extremely repetitive and therefore unnatural. Such a static delay in addition generates comb-filter effects, i.e. undesired spectral colorations in the reconstructed signal.

A use in simple time delays in addition results in the known precedence effect (see, for example: J. Blauert: "Spatial hearing: The psychophysics of human sound localization"; MIT Press, Revised edition, 1997). Same originates from the fact that there is an output channel leading in terms of time and an output channel following in terms of time when a simple time delay is used. The human ear perceives the origin of a tone or sound or an object in that spatial direction from which it first hears the noise. I.e., the signal source is perceived in that direction in which the signal portion of the temporally leading output channel (leading signal) happens to be played back, irrespective of whether the spatial parameters actually responsible for the spatial allocation indicate something different.

SUMMARY

According to an embodiment, a decorrelator for generating output signals based on an audio input signal may have a mixer for combining a representation of the audio input signal delayed by a delay time with the audio input signal so as to acquire a first and a second output signal comprising time-varying portions of the audio input signal and the delayed representation of the audio input signal, wherein in a first time interval, the first output signal contains a proportion of more than 50 percent of the audio input signal and the second output signal contains a proportion of more than 50 percent of the delayed representation of the audio input signal, and wherein in a second time interval, the first output signal contains a proportion of more than 50 percent of the delayed representation of the audio input signal, and the second output signal contains a proportion of more than 50 percent of the audio input signal.

According to an embodiment, a method of generating output signals based on an audio input signal may have the steps of combining a representation of the audio input signal delayed by a delay time with the audio signal so as to acquire a first and a second output signal comprising time-varying portions of the audio input signal and the delayed representation of the audio input signal, wherein in a first time interval, the first output signal contains a proportion of more than 50 percent of the audio input signal, and the second output signal contains a proportion of more than 50 percent of the delayed representation of the audio input signal, and wherein in a second time interval, the first output signal contains a proportion of more than 50 percent of the delayed representation of the audio input signal, and the second output signal contains a proportion of more than 50 percent of the audio input signal.

According to an embodiment, an audio decoder for generating a multi-channel output signal based on an audio input signal may have a decorrelator for generating output signals based on an audio input signal, having a mixer for combining a representation of the audio input signal delayed by a delay time with the audio input signal so as to acquire a first and a second output signal comprising time-varying portions of the audio input signal and the delayed representation of the audio input signal, wherein in a first time interval, the first output signal contains a proportion of more than 50 percent of the audio input signal and the second output signal contains a proportion of more than 50 percent of the delayed representation of the audio input signal, and wherein in a second time interval, the first output signal contains a proportion of more than 50 percent of the delayed representation of the audio input signal, and the second output signal contains a proportion of more than 50 percent of the audio input signal; and a standard decorrelator, wherein the audio decoder is configured to use, in a standard mode of operation, the standard decorrelator, and to use, in the case of a transient audio input signal, the inventive decorrelator.

An embodiment may have a computer program with a program code for performing the method of generating output signals based on an audio input signal with the steps of combining a representation of the audio input signal delayed by a delay time with the audio signal so as to acquire a first and a second output signal comprising time-varying portions of the audio input signal and the delayed representation of the audio input signal, wherein in a first time interval, the first output signal contains a proportion of more than 50 percent of the audio input signal, and the second output signal contains a proportion of more than 50 percent of the delayed representation of the audio input signal, and wherein in a second time interval, the first output signal contains a proportion of more than 50 percent of the delayed representation of the audio input signal, and the second output signal contains a proportion of more than 50 percent of the audio input signal, when the program runs on a computer.

Here, the present invention is based on the finding that, for transient audio input signals, decorrelated output signals may be generated in that the audio input signal is mixed with a representation of the audio input signal delayed by a delay time such that, in a first time interval, a first output signal corresponds to the audio input signal and a second output signal corresponds to the delayed representation of the audio input signal, wherein, in a second time interval, the first output signal corresponds to the delayed representation of the audio input signal and the second output signal corresponds to the audio input signal.

In other words, two signals decorrelated from each other are derived from an audio input signal such that first a time-delayed copy of the audio input signal is generated. Then the two output signals are generated in that the audio input signal and the delayed representation of the audio input signal are alternately used for the two output signals.

In a time-discrete representation, this means that the series of samples of the output signals are alternately used directly from the audio input signal and from the delayed representation of the audio input signal. For generating the decorrelated signal, here a time delay is used which is frequency-independent and therefore does not temporally smear the attacks of the clapping noise. In the case of a time-discrete representation, a time delay chain exhibiting a low number of memory elements is a good trade-off between the achievable spatial width of a reconstructed signal and the additional memory requirements. The delay time chosen is advantageously to be smaller than 50 ms and especially advantageously to be smaller than or equal to 30 ms.

Therefore, the problem of the precedence is solved in that, in a first time interval, the audio input signal directly forms the left channel, whereas, in the subsequent second time interval, the delayed representation of the audio input signal is used as the left channel. The same procedure applies to the right channel.

In an embodiment, the switching time between the individual swapping processes is selected to be longer than the period of a transient event typically occurring in the signal. I.e., if the leading and the subsequent channel are periodically (or randomly) swapped at intervals (of a length of 100 ms, for example), a corruption of the direction locating due to the sluggishness of the human hearing apparatus may be suppressed if the choice of the interval length is suitably made.

According to the invention, it is therefore possible to generate a broad sound field which does not corrupt transient signals (such as clapping) and in addition neither exhibits a repetitive sound character.

The inventive decorrelators use an extremely small number of arithmetic operations only. In particular, only one single time delay and a small number of multiplications are required to inventively generate decorrelated signals. The swapping of individual channels is a simple copy operation and requires no additional computing expenditure. Optional signal-adaptation and/or post-processing methods also only necessitate an addition or a subtraction, respectively, i.e. operations that may typically be taken over by already existing hardware. Therefore, only a very small amount of additional memory is required for implementing the delaying means or the delay line. Same exists in many systems and may be used along with them, as the case may be.

BRIEF DESCRIPTION OF THE DRAWINGS

In the following, embodiments of the present invention are explained in greater detail referring to the accompanying drawings, in which.

DETAILED DESCRIPTION OF THE INVENTION

Figure 1:
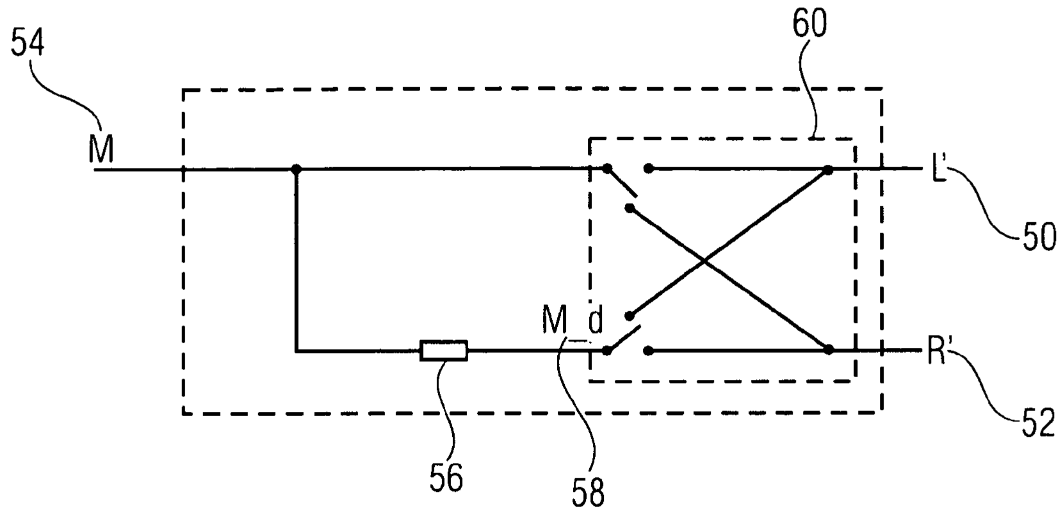
FIG. 1 shows an embodiment of an inventive decorrelator.

FIG. 1 shows an example of an inventive decorrelator for generating a first output signal 50 (L') and a second output signal 52 (R'), based on an audio input signal 54 (M).

The decorrelator further includes delaying means 56 so as to generate a delayed representation of the audio input signal 58 (M_d). The decorrelator further comprises a mixer 60 for combining the delayed representation of the audio input signal 58 with the audio input signal 54 so as to obtain the first output signal 50 and the second output signal 52. The mixer 60 is formed by the two schematically illustrated switches, by means of which the audio input signal 54 is alternately switched to the left output signal 50 and the right output signal 52. Same also applies to the delayed representation of the audio input signal 58. The mixer 60 of the decorrelator therefore functions such that, in a first time interval, the first output signal 50 corresponds to the audio input signal 54 and the second output signal corresponds to the delayed representation of the audio input signal 58, wherein, in a second time interval, the first output signal 50 corresponds to the delayed representation of the audio input signal and the second output signal 52 corresponds to the audio input signal 54.

That is, according to the invention, a decorrelation is achieved in that a time-delayed copy of the audio input signal 54 is prepared and that then the audio input signal 54 and the delayed representation of the audio input signal 58 are alternately used as output channels. I.e., the components forming the output signals (audio input signal 54 and delayed representation of the audio input signal 58) are swapped in a clocked manner. Here, the length of the time interval for which each swapping is made, or for which an input signal corresponds to an output signal, is variable. In addition, the time intervals for which the individual components are swapped may have different lengths. This means then that the ratio of those times in which the first output signal 50 consists of the audio input signal 54 and the delayed representation of the audio input signal 58 may be variably adjusted.

Here, the period of the time intervals is longer than the average period of transient portions contained in the audio input signal 54 so as to obtain good reproduction of the signal.

Suitable time periods here are in the time interval of 10 ms to 200 ms, a typical time period being 100 ms, for example.

In addition to the switching time intervals, the period of the time delay may be adjusted to the conditions of the signal or may even be time variable. The delay times are found in an interval from 2 ms to 50 ms. Examples of suitable delay times are 3, 6, 9, 12, 15 or 30 ms.

The inventive decorrelator shown in FIG. 1 for one thing enables generating decorrelated signals that do not smear the attack, i.e. the beginning, of transient signals and in addition ensure a very high decorrelation of the signal, which results in the fact that a listener perceives a multi-channel signal reconstructed by means of such a decorrelated signal as a particularly spatially extended signal.

As can be seen from FIG. 1, the inventive decorrelator may be employed both for continuous audio signals and for sampled audio signals, i.e. for signals that are present as a sequence of discrete samples.

Figure 2:
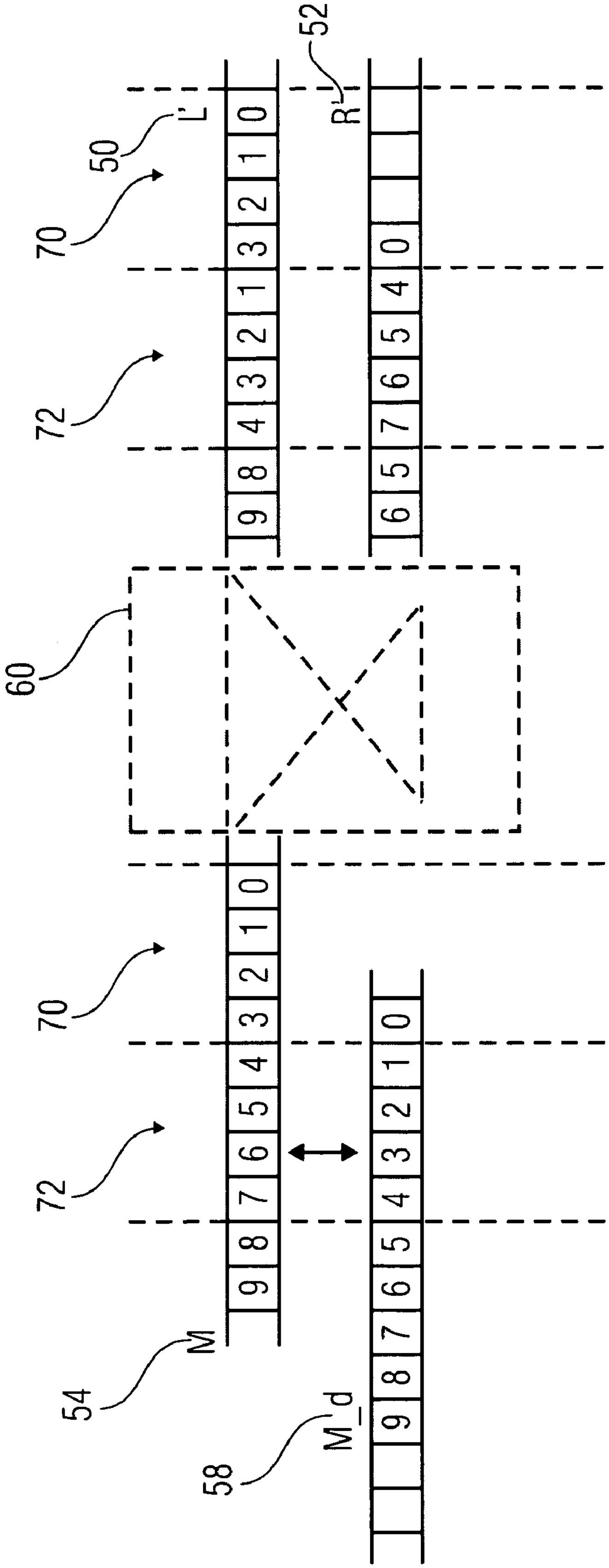
FIG. 2 shows an illustration of the inventively generated decorrelated signals.

By means of such a signal present in discrete samples, FIG. 2 shows the operation of the decorrelator of FIG. 1.

Here, the audio input signal 54 present in the form of a sequence of discrete samples and the delayed representation of the audio input signal 58 is considered. The mixer 60 is only represented schematically as two possible connecting paths between the audio input signal 54 and the delayed representation of the audio input signal 58 and the two output signals 50 and 52. In addition, a first time interval 70 is shown, in which the first output signal 50 corresponds to the audio input signal 54 and the second output signal 52 corresponds to the delayed representation of the audio input signal 58. According to the operation of the mixer, in the second time interval 72, the first output signal 50 corresponds to the delayed representation of the audio input signal 58 and the second output signal 52 corresponds to the audio input signal 54.

In the case shown in FIG. 2, the time periods of the first time interval 70 and the second time interval 72 are identical, while this is not a precondition, as explained above.

In the case represented, it amounts to the temporal equivalent of four samples, so that at a clock of four samples, a switch is made between the two signals 54 and 58 so as to form the first output signal 50 and the second output signal 52.

The inventive concept for decorrelating signals may be employed in the time domain, i.e. with the temporal resolution given by the sample frequency. The concept may just as well be applied to a filter-bank representation of a signal in which the signal (audio signal) is split into several discrete frequency ranges, wherein the signal per frequency range is usually present with reduced time resolution.

Figure 2A:
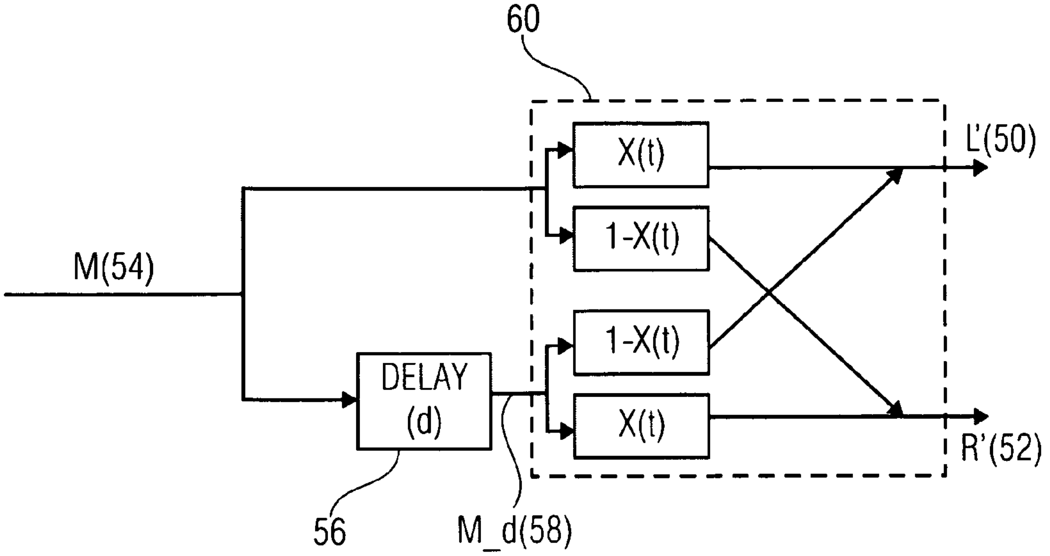
FIG. 2*a* shows a further embodiment of an inventive decorrelator.
Figure 2B:
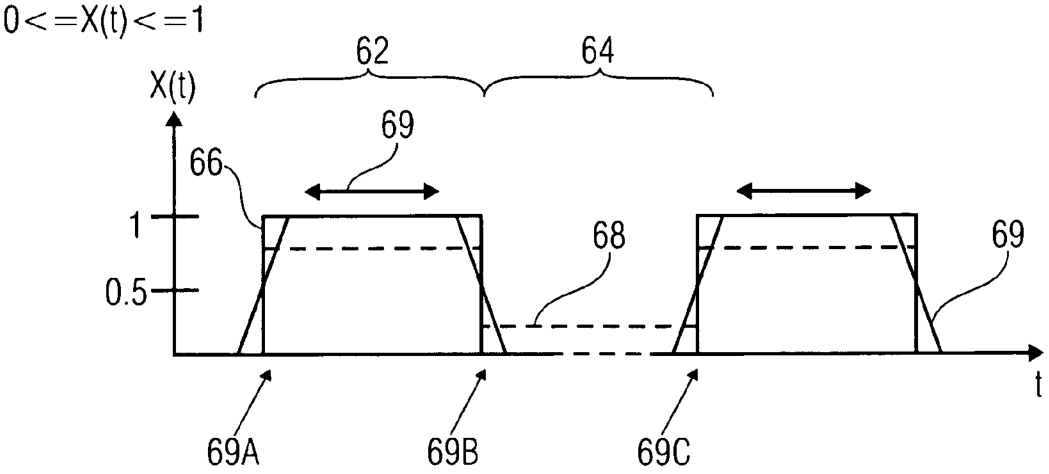
FIG. 2*b* shows embodiments of possible control signals for the decorrelator of FIG. 2*a;*

FIG. 2*a* shows a further embodiment, in which the mixer 60 is configured such that, in a first time interval, the first output signal 50 is to a first proportion X(t) formed from the audio input signal 54 and to a second proportion (1−X(t)) formed from the delayed representation of the audio input signal 58. Accordingly, in the first time interval, the second output signal 52 is to a proportion X(t) formed from the delayed representation of the audio input signal 58 and to a proportion (1−X(t)) formed from the audio input signal 54. Possible implementations of the function X(t), which may be referred to as a cross-fade function, are shown in FIG. 2*b*. All implementations have in common that the mixer 60 functions such that same combines a representation of the audio input signal 58 delayed by a delay time with the audio input signal 54 so as to obtain the first output signal 50 and the second output signal 52 with time-varying portions of the audio input signal 54 and the delayed representation of the audio input signal 58. Here, in a first time interval, the first output signal 50 is formed, to a proportion of more than 50%, from the audio input signal 54, and the second output signal 52 is formed, to a proportion of more than 50%, from the delayed representation of the audio input signal 58. In a second time interval, the first output signal 50 is formed of a proportion of more than 50% of the delayed representation of the audio input signal 58, and the second output signal 52 is formed of a proportion of more than 50% of the audio input signal.

FIG. 2*b* shows possible control functions for the mixer 60 as represented in FIG. 2*a*. Time t is plotted on the x axis in the form of arbitrary units, and the function X(t) exhibiting possible function values from zero to one is plotted on the y axis. Other functions X(t) may also be used which do not necessarily exhibit a value range of 0 to 1. Other value ranges, such as from 0 to 10, are conceivable. Three examples of functions X(t) determining the output signals in the first time interval 62 and the second time interval 64 are represented.

A first function 66, which is represented in the form of a box, corresponds to the case of swapping the channels, as described in FIG. 2, or the switching without any cross-fading, which is schematically represented in FIG. 1. Considering the first output signal 50 of FIG. 2*a*, same is completely formed by the audio input signal 54 in the first time interval 62, whereas the second output signal 52 is completely formed by the delayed representation of the audio input signal 58 in the first time interval 62. In the second time interval 64, the same applies vice versa, wherein the length of the time intervals is not mandatorily identical.

A second function 58 represented in dashed lines does not completely switch the signals over and generates first and second output signals 50 and 52, which at no point in time are formed completely from the audio input signal 54 or the delayed representation of the audio input signal 58. However, in the first time interval 62, the first output signal 50 is, to a proportion of more than 50%, formed from the audio input signal 54, which correspondingly also applies to the second output signal 52.

A third function 69 is implemented such that it is of such a nature that, at cross-fading times 69*a* to 69*c*, which correspond to the transient times between the first time interval 62 and the second time interval 64, which therefore mark those times at which the audio output signals are varied, same achieves a cross-fade effect. This is to say that, in a begin interval and an end interval at the beginning and the end of the first time interval 62, the first output signal 50 and the second output signal 52 contain portions of both the audio input signal 58 and the delayed representation of the audio input signal.

In an intermediate time interval 69 between the begin interval and the end interval, the first output signal 50 corresponds to the audio input signal 54 and the second output signal 52 corresponds to the delayed representation of the audio input signal 58. The steepness of the function 69 at the cross-fade times 69*a* to 69*c* may be varied in far limits so as to adjust the perceived reproduction quality of the audio signal to the conditions. However, it is ensured in any case that, in a first time interval, the first output signal 50 contains a proportion of more than 50% of the audio input signal 54 and the second output signal 52 contains a proportion of more than 50% of the delayed representation of the audio input signal 58, and that, in a second time interval 64, the first output signal 50 contains a proportion of more than 50% of the delayed representation of the audio input signal 58 and the second output signal 52 contains a proportion of more than 50% of the audio input signal 54.

Figure 3:
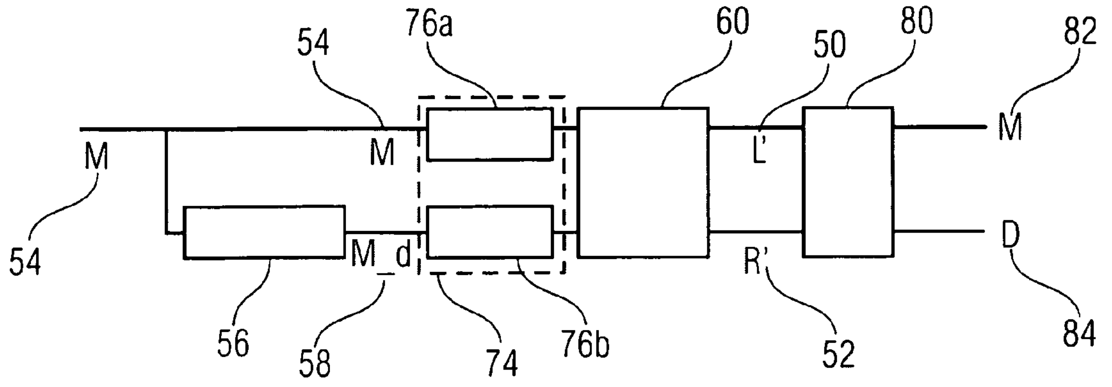
FIG. 3 shows a further embodiment of an inventive decorrelator

FIG. 3 shows a further embodiment of a decorrelator implementing the inventive concept. Here, components identical or similar in function are designated with the same reference numerals as in the preceding examples.

In general, what applies in the context of the entire application is that components identical or similar in function are designated with the same reference numerals so that the description thereof in the context of the individual embodiments may be interchangeably applied to one another.

The decorrelator shown in FIG. 3 differs from the decorrelator schematically presented in FIG. 1 in that the audio input signal 54 and the delayed representation of the audio input signal 58 may be scaled by means of optional scaling means 74, prior to being supplied to the mixer 60. The optional scaling means 74 here comprises a first scaler 76*a* and a second scaler 76*b*, the first scaler 76*a* being able to scale the audio input signal 54 and the second scaler 76*b* being able to scale the delayed representation of the audio input signal 58.

The delaying means 56 is fed by the audio input signal (monophonic) 54. The first scaler 76*a* and the second scaler 76*b* may optionally vary the intensity of the audio input signal and the delayed representation of the audio input signal. What is advantageous here is that the intensity of the lagging signal (G_lagging), i.e. of the delayed representation of the audio input signal 58, be increased and/or the intensity of the leading signal (G_leading), i.e. of the audio input signal 54, be decreased. The change in intensity may here be effected by means of the following simple multiplicative operations, wherein a suitably chosen gain factor is multiplied to the individual signal components:

$$L' = M * G\_\text{leading}$$

$$R' = M\_d * G\_\text{lagging}.$$

Here the gain factors may be chosen such that the total energy is obtained. In addition, the gain factors may be defined such that same change in dependence on the signal. In the case of additionally transferred side information, i.e. in the case of multi-channel audio reconstruction, for example, the gain factors may also depend on the side information so that same are varied in dependence on the acoustic scenario to be reconstructed.

By the application of gain factors and by the variation of the intensity of the audio input signal 54 or the delayed representation of the audio input signal 58, respectively, the precedence effect (the effect resulting from the temporally delayed repetition of the same signal) may be compensated by changing the intensity of the direct component with respect to the delayed component such that delayed components are boosted and/or the non-delayed component is attenuated. The precedence effect caused by the delay introduced may also partly be compensated for by volume adjustments (intensity adjustments), which are important for spatial hearing.

As in the above case, the delayed and the non-delayed signal components (the audio input signal 54 and the delayed representation of the audio input signal 58) are swapped at a suitable rate, i.e.:

L'=M and R'=M_d in a first time interval and

L'=M_d and R'=M in a second time interval.

If the signal is processed in frames, i.e. in discrete time segments of a constant length, the time interval of the swapping (swap rate) is an integer multiple of the frame length. One example of a typical swapping time or swapping period is 100 ms.

The first output signal 50 and the second output signal 52 may directly be output as an output signal, as shown in FIG. 1. When the decorrelation occurs on the basis of transformed signals, an inverse transformation is, of course, required after decorrelation. The decorrelator in FIG. 3 additionally comprises an optional post-processor 80 which combines the first output signal 50 and the second output signal 52 so as to provide at its output a post-processed output signal 82 and a second post-processed output signal 84, wherein the post-processor may comprise several advantageous effects. For one thing, it may serve to prepare the signal for further method steps such as a subsequent upmix in a multi-channel reconstruction such that an already existing decorrelator may be replaced by the inventive decorrelator without having to change the rest of the signal-processing chain.

Figure 7:
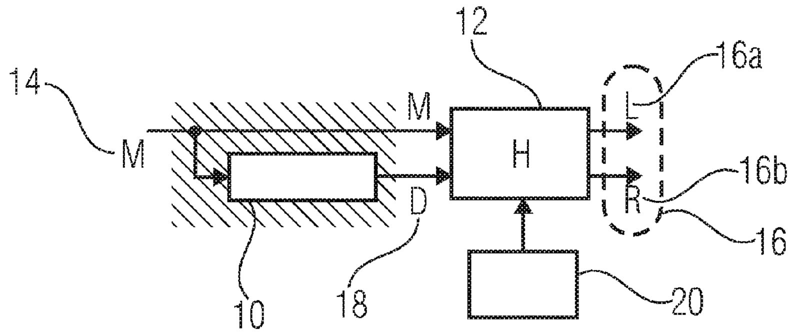
FIG 7 Prior Art
FIG. 7 shows an example of a conventional upmixer.
Figure 8:
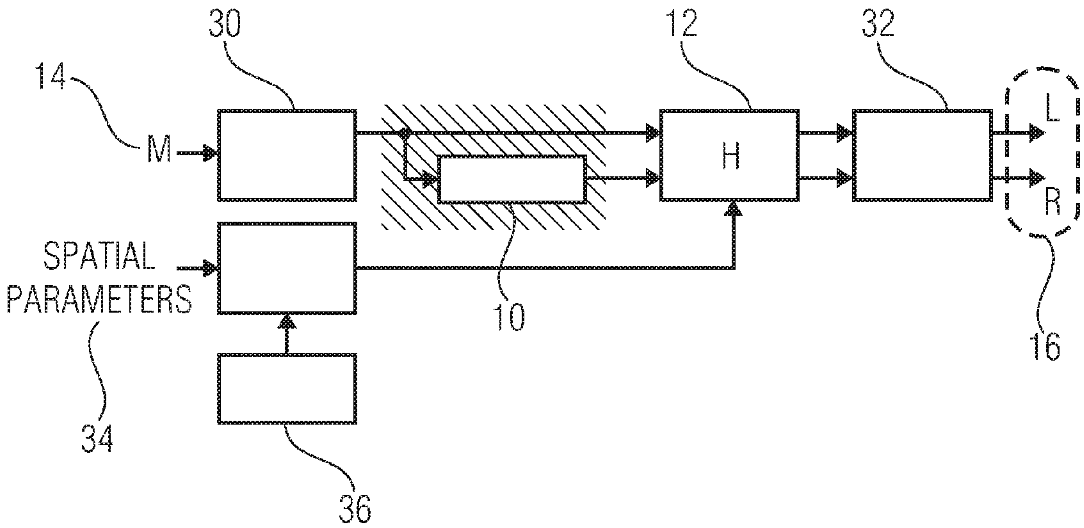
FIG 8 Prior Art
FIG. 8 shows a further example of a conventional upmixer/decoder.

Therefore, the decorrelator shown in FIG. 7 may fully replace the conventional decorrelators or standard decorrelators 10 of FIGS. 7 and 8, whereby the advantages of the inventive decorrelators may be integrated into already existing decoder setups in a simple manner.

One example of a signal post-processing as it may be performed by the post-processor 80 is given by means of the following equations which describe a center-side (MS) coding:

$$M = 0.707 * (L' + R')$$

$$D = 0.707 * (L' - R').$$

In a further embodiment, the post-processor 80 is used for reducing the degree of mixing of the direct signal and the delayed signal. Here, the normal combination represented by means of the above formula may be modified such that the first output signal 50 is substantially scaled and used as a first post-processed output signal 82, for example, whereas the second output signal 52 is used as a basis for the second post-processed output signal 84. The post-processor and the mix matrix describing the post-processor may here either be fully bypassed or the matrix coefficients controlling the combination of the signals in the post-processor 80 may be varied such that little or no additional mixing of the signals will occur.

Figure 4:
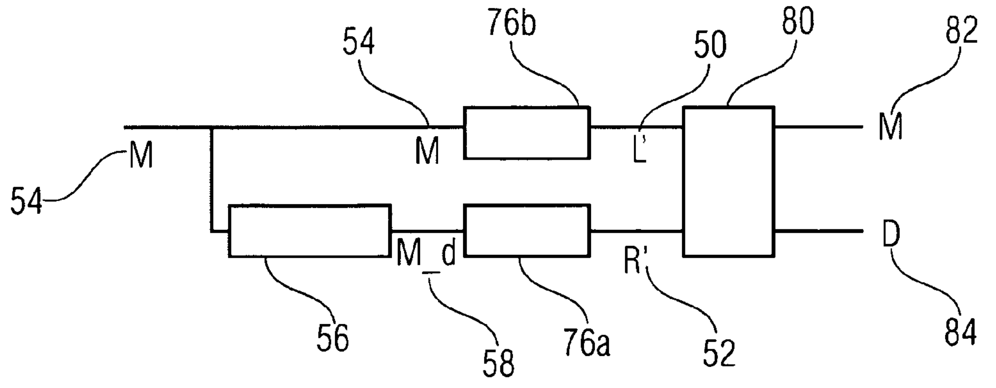
FIG. 4 shows an example of an apparatus for generating decorrelated signals.

FIG. 4 shows a further way of avoiding the precedence effect by means of a suitable correlator. Here, the first and second scaling units 76*a* and 76*b* shown in FIG. 3 are obligatory, whereas the mixer 60 may be omitted.

Here, in analogy to the above-described case, either the audio input signal 54 and/or the delayed representation of the audio input signal 58 is altered and varied in its intensity. In order to avoid the precedence effect, either the intensity of the delayed representation of the audio input signal 58 is increased and/or the intensity of the audio input signal 54 is decreased, as can be seen from the following equations:

$L'=M*G\_leading$ $R'=M\_d*G\_lagging.$

Here, the intensity is varied in dependence on the delay time of the delaying means 56 so that a larger decrease of the intensity of the audio input signal 54 may be achieved with shorter delay time.

Advantageous combinations of delay times and the pertaining gain factors are summarized in the following table:

| Delay (ms) | 3 | 6 | 9 | 12 | 15 | 30 |
|---|---|---|---|---|---|---|
| Gain factor | 0.5 | 0.65 | 0.65 | 0.7 | 0.8 | 0.9 |

The scaled signals may then be arbitrarily mixed, for example by means of one of a center-side encoder described above or any of the other mixing algorithms described above.

Therefore, by the scaling of the signal, the precedence effect is avoided, by reducing the temporally leading component in its intensity. This serves to generate a signal, by means of mixing, which does not temporally smear the transient portions contained in the signal and in addition does not cause any undesired corruption of the sound impression by means of the precedence effect.

Figure 5:
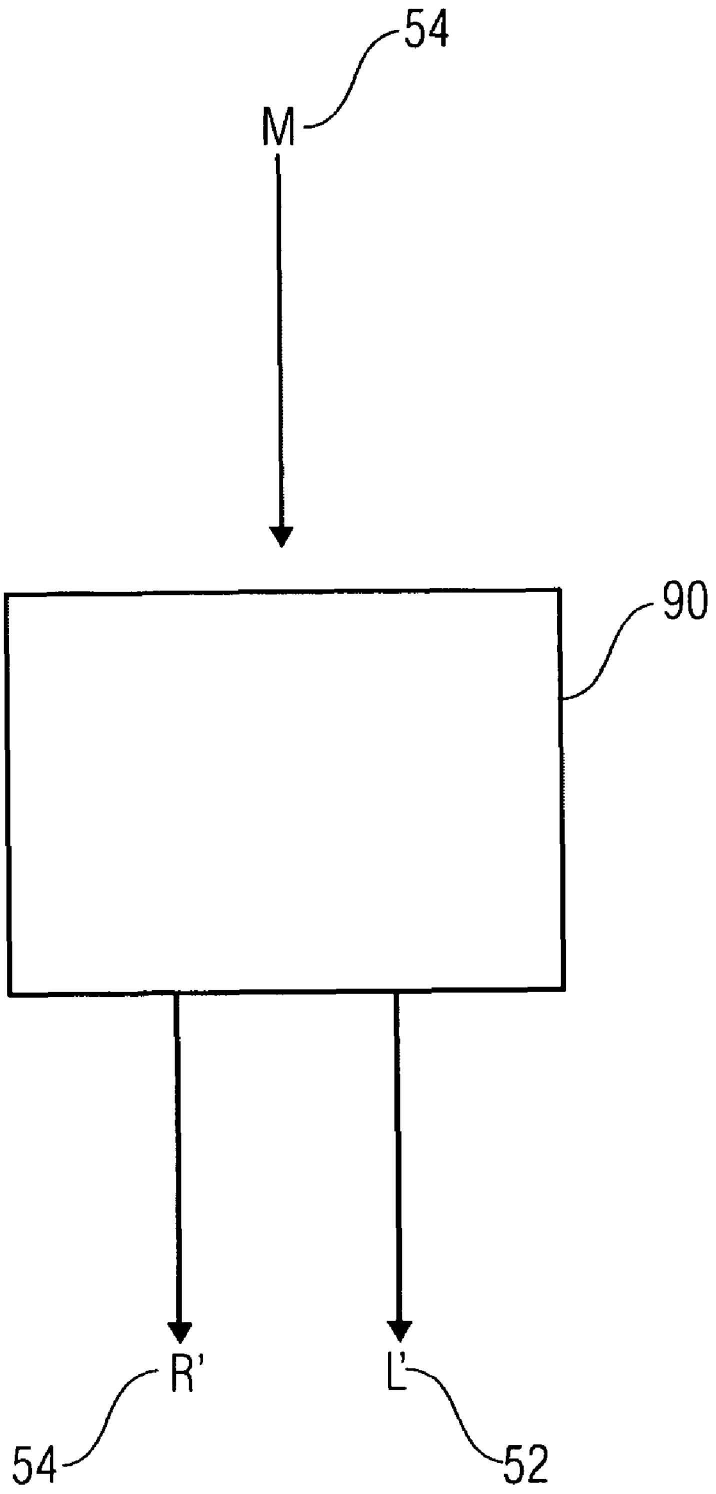
FIG. 5 shows an example of an inventive method for generating output signals.

FIG. 5 schematically shows an example of an inventive method of generating output signals based on an audio input signal 54. In a combination step 90, a representation of the audio input signal 54 delayed by a delay time is combined with the audio input signal 54 so as to obtain a first output signal 52 and a second output signal 54, wherein, in a first time interval, the first output signal 52 corresponds to the audio input signal 54 and the second output signal corresponds to the delayed representation of the audio input signal, and wherein, in a second time interval, the first output signal 52 corresponds to the delayed representation of the audio input signal and the second output signal 54 corresponds to the audio input signal.

Figure 6:
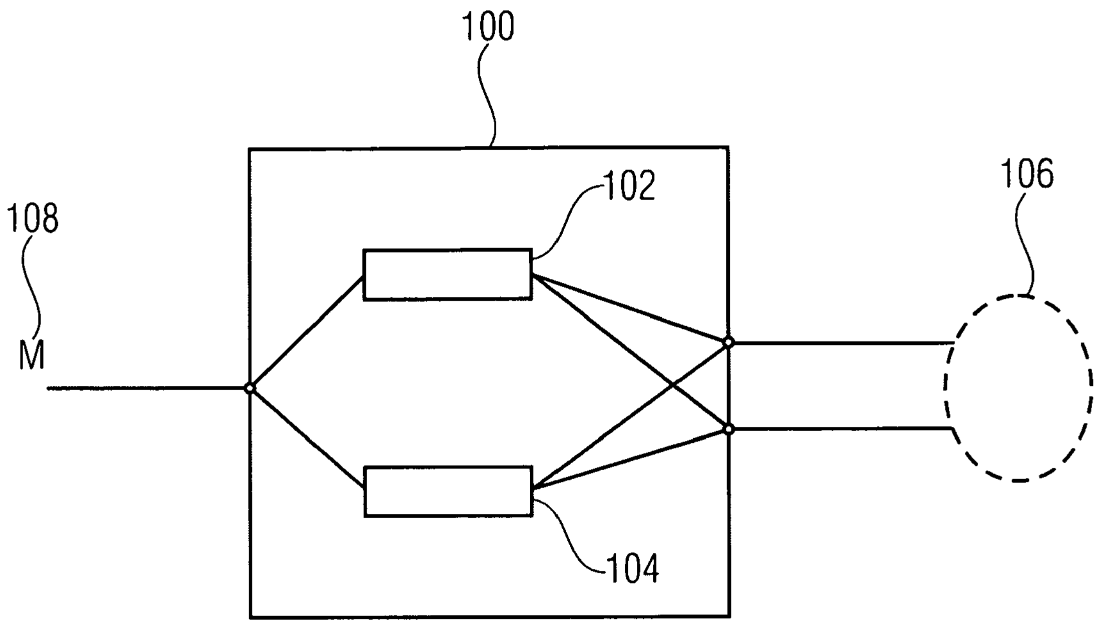
FIG. 6 shows an example of an inventive audio decoder.

FIG. 6 shows the application of the inventive concept in an audio decoder. An audio decoder 100 comprises a standard decorrelator 102 and a decorrelator 104 corresponding to one of the inventive decorrelators described above. The audio decoder 100 serves for generating a multi-channel output signal 106 which in the case shown exemplarily exhibits two channels. The multi-channel output signal is generated based on an audio input signal 108 which, as shown, may be a mono signal. The standard decorrelator 102 corresponds to the conventional decorrelators, and the audio decoder is made such that it uses the standard decorrelator 102 in a standard mode of operation and alternatively uses the decorrelator 104 with a transient audio input signal 108. Thus, the multi-channel representation generated by the audio decoder is also feasible in good quality in the presence of transient input signals and/or transient downmix signals.

Therefore, it is the basic intention is to use the inventive decorrelators when strongly decorrelated and transient signals are to be processed. If there is the chance of recognizing transient signals, the inventive decorrelator may alternatively be used instead of a standard decorrelator.

If decorrelation information is additionally available (for example an ICC parameter describing the correlation of two output signals of a multi-channel downmix in MPEG Surround standard), same may additionally be used as a decisive criterion for deciding which decorrelator to use. In the case of small ICC values (such as values smaller than 0.5, for example) outputs of the inventive decorrelators (such as of the decorrelator of FIGS. 1 and 3) may be used, for example. For non-transient signals (such as tonal signals) standard decorrelators are therefore used so as to ensure the optimum reproduction quality at any time.

I.e., the application of the inventive decorrelators in the audio decoder 100 is signal-dependent. As mentioned above, there are ways of detecting transient signal portions (such as LPC prediction in the signal spectrum or a comparison of the energies contained in the low-frequency spectral domain in the signal to those in the high spectral domain). In many decoder scenarios, these detection mechanisms already exist or may be implemented in a simple manner. One example of already existing indicators are the above-mentioned correlation or coherence parameters of a signal. In addition to the simple recognition of the presence of transient signal portions, these parameters may be used to control the intensity of the decorrelation of the output channels generated.

Examples of the use of already existing detection algorithms for transient signals are MPEG Surround, where the control information of the STP tool is suitable for detection and the inter-channel coherence parameters (ICC) may be used. Here, the detection may be effected both on the encoder side and on the decoder side. In the former case, a signal flag or bit would have to be transmitted, which is evaluated by the audio decoder 100 so as to switch to and fro between the different decorrelators. If the signal-processing scheme of the audio decoder 100 is based on overlapping windows for the reconstruction of the final audio signal and if the overlapping of the adjacent windows (frames) is large enough, a simple switching among the different decorrelators may be effected without the result of the introduction of audible artefacts.

If this is not the case, several measures may be taken to enable an approximately inaudible transition among the different decorrelators. For one thing, a cross-fading technique may be used, wherein both decorrelators are first used in parallel. The signal of the standard decorrelator 102 is in the transition to the decorrelator 104 slowly faded out in its intensity, whereas the signal of the decorrelator 104 is simultaneously faded in. In addition, hysteresis switch curves may be used in the to-and-fro switching, which ensure that a decorrelator, after the switching thereto, is used for a predetermined minimum amount of time so as to prevent multiple direct to-and-fro switching among the various decorrelators.

In addition to the volume effects, other perception psychological effects may occur when different decorrelators are used.

This is particularly the case as the inventive decorrelators are able to generate a specifically "wide" sound field. In a downstream mix matrix, a certain amount of a decorrelated signal is added to a direct signal in the four-channel audio reconstruction. Here, the amount of the decorrelated signal and/or the dominance of the decorrelated signal in the output signal generated typically determines the width of the sound field perceived. The matrix coefficients of this mix matrix are typically controlled by the above-mentioned correlation parameters transferred and/or other spatial parameters. Therefore, prior to the switching to an inventive decorrelator, the width of the sound field may at first be artificially increased by altering the coefficients of the mix matrix such that the wide sound impression arises slowly before a switch is made to the inventive decorrelators. In the other case of the switching from the inventive decorrelator, the width of the sound impression may likewise be decreased prior to the actual switching.

Of course, the above-described switching scenarios may also be combined to achieve a particularly smooth transition between different decorrelators.

To summarize, the inventive decorrelators have a number of advantages as compared to the standard, which particularly come to bear in the reconstruction of applause-like signals, i.e. signals having a high transient signal portion. On the one hand, an extremely wide sound field is generated without the introduction of additional artefacts, which is particularly advantageous in the case of transient, applause-like signals. As has repeatedly been shown, the inventive decorrelators may easily be integrated in already existing playback chains and/or decoders and may even be controlled by parameters already present in these decoders so as to achieve the optimum reproduction of a signal. Examples of the integration into such existing decoder structures have previously been given in the form of Parametric Stereo and MPEG Surround. In addition, the inventive concept manages to provide decorrelators making only extremely small demands on the computing power available, so that, for one thing, no expensive investing in hardware is required and, for the other thing, the additional energy consumption of the inventive decorrelators is negligible.

Although the preceding discussion has mainly been presented with respect to discrete signals, i.e. audio signals, which are represented by a sequence of discrete samples, this only serves for better understanding. The inventive concept is also applicable to continuous audio signals, as well as to other representations of audio signals, such as parameter representations in frequency-transformed spaces of representation.

Depending on the conditions, the inventive method of generating output signals may be implemented in hardware or in software. The implementation may be effected on a digital storage medium, in particular a floppy disk or a CD, with electronically readable control signals, which may cooperate such with a programmable computer system that the inventive method of generating audio signals is effected. In general, the invention therefore also consists in a computer program product with a program code for performing the inventive method stored on a machine-readable carrier when the computer program product runs on a computer. In other words, the invention may, therefore, be realized as a computer program with a program code for performing the method when the computer program runs on a computer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Decorrelator for generating output signals based on an audio input signal, comprising:

a mixer for combining a representation of the audio input signal delayed by a delay time with the audio input signal so as to acquire a first and a second output signal comprising time-varying portions of the audio input signal and the delayed representation of the audio input signal, wherein in a first time interval, the first output signal contains a proportion of more than 50 percent of the audio input signal and the second output signal contains a proportion of more than 50 percent of the delayed representation of the audio input signal, and wherein in a second time interval, the first output signal contains a proportion of more than 50 percent of the delayed representation of the audio input signal, and the second output signal contains a proportion of more than 50 percent of the audio input signal.

2. Decorrelator of claim 1, wherein, in the first time interval the first output signal corresponds to the audio input signal, and the second output signal corresponds to the delayed representation of the audio input signal, wherein in the second time interval, the first output signal corresponds to the delayed representation of the audio input signal and the second output signal corresponds to the audio input signal.

3. Decorrelator of claim 1, wherein, in a begin interval and an end interval at the beginning and at the end of the first time interval, the first output signal and the second output signal comprise portions of the audio input signal and the delayed representation of the audio input signal, wherein in an intermediate interval between the begin interval and the end interval of the first time interval, the first output signal corresponds to the audio input signal, and the second output signal corresponds to the delayed representation of the audio input signal; and wherein in a begin interval and in an end interval at the beginning and at the end of the second time interval, the first output signal and the second output signal comprise portions of the audio input signal and the delayed representation of the audio input signal, wherein in an intermediate interval between the begin interval and the end interval of the second time interval, the first output signal corresponds to the delayed representation of the audio input signal, and the second output signal corresponds to the audio input signal.

4. Decorrelator of claim 1, wherein the first and second time intervals are temporally adjacent and successive.

5. Decorrelator of claim 1, further comprising a delayer so as to generate the delayed representation of the audio input signal by time-delaying the audio input signal by the delay time.

6. Decorrelator of claim 1, further comprising a scaler so as to alter an intensity of the audio input signal and/or the delayed representation of the audio input signal.

7. Decorrelator of claim 6, wherein the scaler is configured to scale the intensity of the audio input signal in dependence on the delay time such that a larger decrease in the intensity of the audio input signal is acquired with a shorter delay time.

8. Decorrelator of claim 1, further comprising a post-processor for combining the first and the second output signal so as to acquire a first and a second post-processed output signal, both the first and the second post-processed output signal comprising signal contributions from the first and second output signals.

9. Decorrelator of claim 8, wherein the post-processor is configured to form the first post-processed output signal M and the second post-processed output signal D from the first output signal L' and the second output signal R' such that the following conditions are met:

$$M=0.707\times(L'+R'), \text{ and}$$

$$D=0.707\times(L'-R').$$

10. Decorrelator of claim 1, wherein the mixer is configured to use a delayed representation of the audio input signal the delay time of which is greater than 2 ms and less than 50 ms.

11. Decorrelator of claim 7, wherein the delay time amounts to 3, 6, 9, 12, 15 or 30 ms.

12. Decorrelator of claim 1, wherein the mixer is configured to combine an audio input signal consisting of discrete samples and a delayed representation of the audio input signal consisting of discrete samples by swapping the samples of the audio input signal and the samples of the delayed representation of the audio input signal.

13. Decorrelator of claim 1, wherein the mixer is configured to combine the audio input signal and the delayed representation of the audio input signal such that the first and second time intervals comprise the same length.

14. Decorrelator of claim 1, wherein the mixer is configured to perform the combination of the audio input signal and the delayed representation of the audio input signal for a sequence of pairs of temporally adjacent first and second time intervals.

15. Decorrelator of claim 1, wherein the mixer is configured to refrain, with a predetermined probability, for one pair of the sequence of pairs of temporally adjacent first and second time intervals, from the combination so that, in the pair in the first and second time intervals, the first output signal corresponds to the audio input signal and the second output signal corresponds to the delayed representation of the audio input signal.

16. Decorrelator of claim 14, wherein the mixer is configured to perform the combination such that the time period of the time intervals in a first pair of a first and a second time interval from the sequence of time intervals differs from a time period of the time intervals in a second pair of a first and a second time interval.

17. Decorrelator of claim 1, wherein the time period of the first and the second time intervals is larger than the double average time period of transient signal portions contained in the audio input signal.

18. Decorrelator of claim 1, wherein the time period of the first and second time intervals is larger than 10 ms and less than 200 ms.

19. Method of generating output signals based on an audio input signal, comprising:

combining a representation of the audio input signal delayed by a delay time with the audio signal so as to acquire a first and a second output signal comprising time-varying portions of the audio input signal and the delayed representation of the audio input signal, wherein in a first time interval, the first output signal contains a proportion of more than 50 percent of the audio input signal, and the second output signal contains a proportion of more than 50 percent of the delayed representation of the audio input signal, and wherein in a second time interval, the first output signal contains a proportion of more than 50 percent of the delayed representation of the audio input signal, and the second output signal contains a proportion of more than 50 percent of the audio input signal.

20. Method of claim 19, wherein, in the first time interval, the first output signal corresponds to the audio input signal, and the second output signal corresponds to the delayed representation of the audio input signal, wherein in the second time interval, the first output signal corresponds to the delayed representation of the audio input signal, and the second output signal corresponds to the audio input signal.

21. Method of claim 19, wherein, in a begin interval and in an end interval at the beginning and at the end of the first time interval, the first output signal and the second output signal comprise portions of the audio input signal and the delayed representation of the audio input signal, wherein in an intermediate interval between the begin interval and the end interval of the first time interval, the first output signal corresponds to the audio input signal, and the second output signal corresponds to the delayed representation of the audio input signal; and wherein in a begin interval and in an end interval at the beginning and at the end of the second time interval, the first output signal and the second output signal comprise portions of the audio input signal and the delayed representation of the audio input signal, wherein in an intermediate interval between the begin interval and the end interval of the second time interval, the first output signal corresponds to the delayed representation of the audio input signal, and the second output signal corresponds to the audio input signal.

22. Method of claim 19, additionally comprising:

delaying the audio input signal by the delay time so as to acquire the delayed representation of the audio input signal.

23. Method of claim 19, additionally comprising:

altering the intensity of the audio input signal and/or the delayed representation of the audio input signal.

24. Method of claim 19, additionally comprising:

combining the first and the second output signal so as to acquire a first and a second post-processed output signal, both the first and the second post-processed output signals containing contributions of the first and the second output signals.

25. Audio decoder for generating a multi-channel output signal based on an audio input signal, comprising:

a decorrelator for generating output signals based on an audio input signal, comprising:

a mixer for combining a representation of the audio input signal delayed by a delay time with the audio input signal so as to acquire a first and a second output signal comprising time-varying portions of the audio input signal and the delayed representation of the audio input signal, wherein in a first time interval, the first output signal contains a proportion of more than 50 percent of the audio input signal and the second output signal contains a proportion of more than 50 percent of the delayed representation of the audio input signal, and wherein in a second time interval, the first output signal contains a proportion of more than 50 percent of the delayed representation of the audio input signal, and the second output signal contains a proportion of more than 50 percent of the audio input signal; and a standard decorrelator, wherein the audio decoder is configured to use, in a standard mode of operation, the standard decorrelator, and to use, in the case of a transient audio input signal, the inventive decorrelator.

26. A non-transitory computer readable medium storing a computer program with a program code for performing, when the computer programs runs on a computer, a method for generating output signals based on an audio input signal, comprising:

combining a representation of the audio input signal delayed by a delay time with the audio signal so as to acquire a first and a second output signal comprising time-varying portions of the audio input signal and the delayed representation of the audio input signal, wherein in a first time interval, the first output signal contains a proportion of more than 50 percent of the audio input signal, and the second output signal contains a proportion of more than 50 percent of the delayed representation of the audio input signal, and wherein in a second time interval, the first output signal contains a proportion of more than 50 percent of the delayed representation of the audio input signal, and the second output signal contains a proportion of more than 50 percent of the audio input signal.

* * * * *